United States Patent
Liu

(10) Patent No.: US 11,934,683 B2
(45) Date of Patent: *Mar. 19, 2024

(54) METHOD AND APPARATUS FOR TESTING MEMORY CHIP, AND STORAGE MEDIUM

(71) Applicant: CHANGXIN MEMORY TECHNOLOGIES, INC., Hefei (CN)

(72) Inventor: Dong Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 198 days.

This patent is subject to a terminal disclaimer.

(21) Appl. No.: 17/663,767

(22) Filed: May 17, 2022

(65) Prior Publication Data

US 2023/0280927 A1 Sep. 7, 2023

(30) Foreign Application Priority Data

Mar. 2, 2022 (CN) .......................... 202210198602.7

(51) Int. Cl.
*G06F 3/06* (2006.01)

(52) U.S. Cl.
CPC .......... *G06F 3/0653* (2013.01); *G06F 3/0604* (2013.01); *G06F 3/0655* (2013.01); *G06F 3/0673* (2013.01)

(58) Field of Classification Search
CPC .... G06F 3/0653; G06F 3/0604; G06F 3/0655; G06F 3/0673
See application file for complete search history.

(56) References Cited

U.S. PATENT DOCUMENTS

2019/0347044 A1* 11/2019 Kim ..................... G06F 3/0659
2023/0161482 A1* 5/2023 Vyas ..................... G11C 29/44
711/103

FOREIGN PATENT DOCUMENTS

CN 111863105 A 10/2020

OTHER PUBLICATIONS

Gries, Matthias. "The impact of recent DRAM architectures on embedded systems performance." Proceedings of the 26th Euromicro Conference. EUROMICRO 2000. Informatics: Inventing the Future. vol. 1. IEEE, 2000. (Year: 2000).*

* cited by examiner

*Primary Examiner* — Nicholas J Simonetti
(74) *Attorney, Agent, or Firm* — Cooper Legal Group, LLC

(57) ABSTRACT

The present disclosure provides a method and an apparatus for testing a memory chip, and a storage medium, and belongs to the technical field of semiconductors. The method for testing a memory chip includes: writing test data into a memory cell of a to-be-tested memory chip; reading stored data from the memory cell; and generating a test result of the to-be-tested memory chip based on the test data and the stored data; wherein in the reading stored data from the memory cell, a row address strobe precharge time is less than a standard row address strobe precharge time of the to-be-tested memory chip, and/or a current sensing delay time of the to-be-tested memory chip is less than a standard sensing delay time of the to-be-tested memory chip.

15 Claims, 8 Drawing Sheets

Data topology 1

10101010
00000000
10101010
00000000

Data topology 2

00000000
10101010
00000000
10101010

Data topology 3

01010101
00000000
01010101
00000000

Data topology 4

METHOD AND APPARATUS FOR TESTING MEMORY CHIP, AND STORAGE MEDIUM

CROSS-REFERENCE TO RELATED APPLICATIONS

This application claims the priority of Chinese Patent Application No. 202210198602.7, submitted to the Chinese Intellectual Property Office on Mar. 2, 2022, the disclosure of which is incorporated herein in its entirety by reference.

TECHNICAL FIELD

The present disclosure relates to the technical field of semiconductors, and in particular, to a method for testing a memory chip, an apparatus for testing a memory chip, and a computer-readable storage medium.

BACKGROUND

A memory chip is widely used in all kinds of electronic products as a main storage component. In order to detect performance of the memory chip, a manufacturer needs to test read and write performance of the memory chip before the memory chip leaves the factory, to detect whether the memory chip is qualified.

However, as the memory chip is getting larger, it takes a longer time to test the memory chip, and as a result, the memory chip has lower production efficiency and a higher cost. In addition, with an increasingly complex internal structure of the memory chip, how to test the memory chip completely and comprehensively has become an urgent problem to be resolved.

It should be noted that the information disclosed above is merely intended to facilitate a better understanding of the background of the present disclosure, and therefore may include information that does not constitute the prior art known to those of ordinary skill in the art.

SUMMARY

The present disclosure provides a method for testing a memory chip, an apparatus for testing a memory chip, and a computer-readable storage medium.

Other features and advantages of the present disclosure will become apparent based on the following detailed description, or partially obtained through practice of the present disclosure.

According to a first aspect of the present disclosure, a method for testing a memory chip is provided, including: writing test data into a memory cell of a to-be-tested memory chip; reading stored data from the memory cell; and generating a test result of the to-be-tested memory chip based on the test data and the stored data; wherein in the reading stored data from the memory cell, a row address strobe precharge time is less than a standard row address strobe precharge time of the to-be-tested memory chip, and/or a current sensing delay time of the to-be-tested memory chip is less than a standard sensing delay time is of the to-be-tested memory chip.

According to a second aspect of the present disclosure, an apparatus for testing a memory chip is provided, including: a processor; and a memory, configured to store an instruction executable by the processor; wherein the processor is configured to execute the instruction executable to execute: writing test data into a memory cell of a to-be-tested memory chip; reading stored data from the memory cell; and generating a test result of the to-be-tested memory chip based on the test data and the stored data; wherein in the reading stored data from the memory cell, a row address strobe precharge time is less than a standard row address strobe precharge time of the to-be-tested memory chip, and/or a current sensing delay time of the to-be-tested memory chip is less than a standard sensing delay time of the to-be-tested memory chip.

According to a third aspect of the present disclosure, a computer-readable storage medium is provided, storing a computer program therein, when the computer program is executed by a processor, the processor implements any one of the foregoing methods for testing a memory chip.

It should be understood that the above general description and the following detailed description are only exemplary and explanatory, and should not be construed as a limitation to the present disclosure.

BRIEF DESCRIPTION OF THE DRAWINGS

The accompanying drawings incorporated into the specification and constituting part of the specification illustrate the implementations of the present disclosure, and serve, together with the specification, to explain the principles of the present disclosure. Apparently, the accompanying drawings in the following description show merely some implementations of the present disclosure, and those of ordinary skill in the art may still derive other accompanying drawings from these drawings without creative efforts.

FIG. 3 is an example of test data according to an exemplary implementation;

FIG. 5A to FIG. 5E are schematic diagrams of writing test data according to an exemplary implementation;

FIG. 6 is a flowchart of another method for testing a memory chip according to an exemplary implementation;

DETAILED DESCRIPTION

The exemplary implementations are described more comprehensively below with reference to the accompanying drawings. However, the exemplary implementations can be implemented in various forms and should not be construed as being limited to examples described herein. On the contrary, these implementations are provided such that the present disclosure is more comprehensive and complete, and fully conveys the concept of the exemplary implementations to those skilled in the art. The described features, structures, or characteristics may be incorporated into one or more implementations in any suitable manner.

The exemplary implementations of the present disclosure first provide a method for testing a memory chip. The method for testing a memory chip can test read and write functions of a to-be-tested memory chip by writing and is reading test data in a memory cell of the to-be-tested memory chip, to determine a test result of the to-be-tested memory chip. In the exemplary implementations, the to-be-tested memory chip may be a dynamic random access memory (DRAM).

Figure 1:
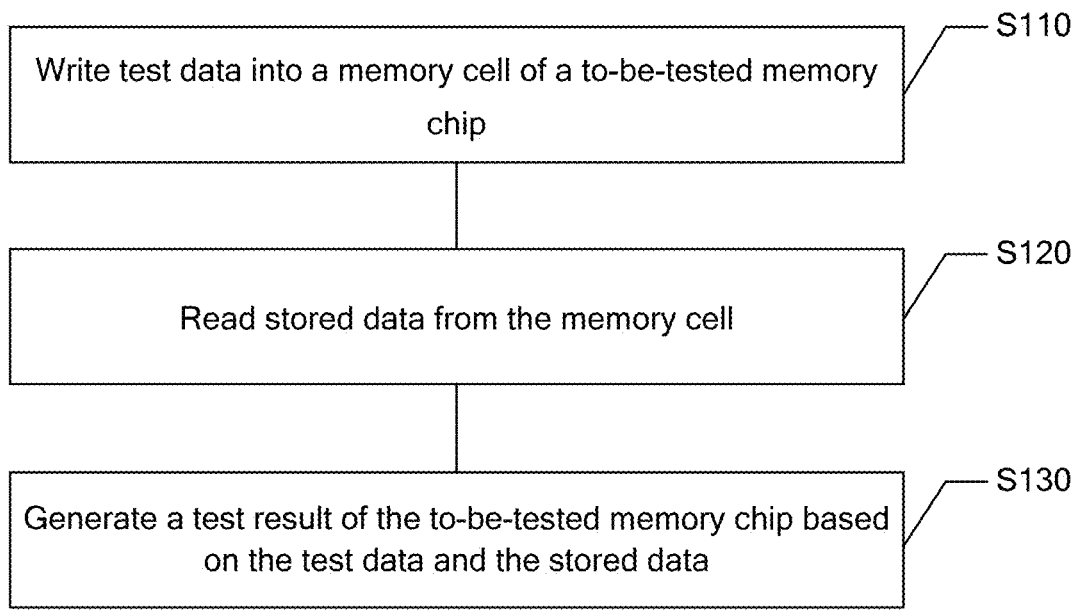
FIG. 1 is a flowchart of a method for testing a memory chip according to an exemplary implementation.

FIG. 1 shows a process according to an exemplary implementation. The process may include the following steps S110 to S130.

Step S110: Write test data into a memory cell of a to-be-tested memory chip.

Figure 2:
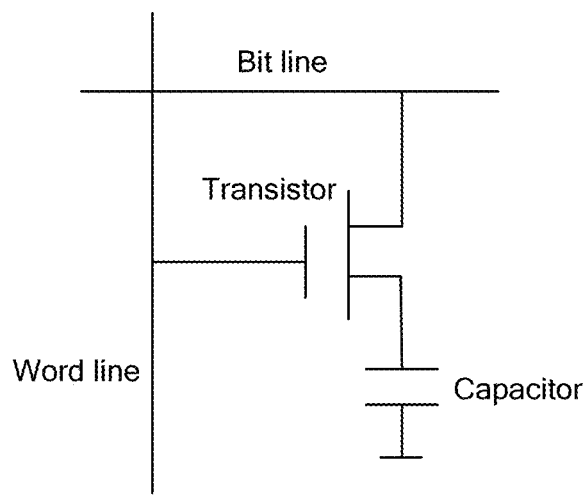
FIG. 2 is a schematic structural diagram of a memory cell according to an exemplary implementation.

The to-be-tested memory chip may include a plurality of memory cells, and each memory cell is a unit with functions of storing, reading and writing data. As shown in FIG. 2, each memory cell is constituted by a transistor and a capacitor. An amount of charge stored in the capacitor may be used to represent whether a binary bit is 0 or 1. The test data are data written into the memory cell to test read and write functions of the memory cell of the to-be-tested memory chip. Because the to-be-tested memory chip stores data in a binary form, the test data may also be a binary sequence with a certain data bit length, that is, the test data may be any sequence composed of 0 and 1, or may be a sequence composed of only 0 or 1. In addition, a sequence length of the test data may be set to a fixed length based on a quantity of memory cells of the to-be-tested memory chip, for example, a column or row number, for example, may be set to a length equal to the column or row number of the memory cell; or may be simply set to any length.

At first, the test data are written into the memory cell of the to-be-tested memory chip. In this process, the write function of the to-be-tested memory chip can be monitored. Specifically, when the test data are written, each piece of data in the binary sequence corresponding to the test data can be written into the memory cell of the to-be-tested memory chip in order, such that 1-bit data, namely, data "0" or "1", is written into each memory cell. When the test data are written into the memory cell, the test data may alternatively be written into the memory cell of the to-be-tested memory chip based on a relationship between a length of the binary sequence corresponding to the test data and the quantity of memory cells of the to-be-tested memory chip. For example, when the length N of the binary sequence corresponding to the test data is less than the quantity M of memory cells of the to-be-tested memory chip, the test data can be written into the memory cells of the to-be-tested memory chip repeatedly based on an order of the memory cells, such that a complete binary sequence is written into every N memory cells. Both M and N are positive integers.

In a design process of the memory chip, the memory cells may be arranged in any shape. For example, the memory cells may be arranged in a plurality of columns. Therefore, in an optional implementation, the to-be-tested memory chip may include a plurality of columns of memory cells, and one or more detection cycles are adopted for each of the columns of memory cells. In this way, step S110 may be implemented by writing the test data into memory cells in a same detection cycle. One detection cycle may be time required to write test data of a fixed length into one column of memory cells. For example, one detection cycle may be time required to write data into one column of memory cells, in other words, one detection cycle is adopted for one column of memory cells; or may be time required to write data of a fixed sequence length into one column of memory cells. The fixed sequence length is less than a quantity of memory cells in one column, for example, may be equal to the length of the binary sequence corresponding to the test data.

Accordingly, in an optional implementation, the to-be-tested memory chip may alternatively include a plurality of rows of memory cells, and one or more detection cycles are adopted for each of the rows of memory cells. The detection cycle may be time required to write test data of a fixed length into one row of memory cells. Therefore, step S110 may alternatively be implemented by writing the test data into memory cells in a same detection cycle. In addition, one detection cycle may alternatively be set to other time based on an arrangement shape of the memory cells and an actual requirement, which is not specially limited in this exemplary implementation.

The test data are written into the memory cells in the same detection cycle, which can ensure that the test data are written correctly and prevent a data writing error in another memory cell due to a failure to write the test data into a memory cell correctly.

In this exemplary implementation, a length and a data structure of the test data may be customized based on a test requirement. For example, in an optional implementation, the test data may be a plurality of binary sequences with equal data bits, and each of the binary sequences has a different data structure. In other words, the test data may include the binary sequences. A length of each binary sequence is a positive integer N, and the binary sequences are different from each other. In this manner, when the test data are written into the memory cell of the to-be-tested memory chip, each binary sequence may be written into a same column or row of memory cells of the to-be-tested memory chip, such that a same binary sequence is written into each column or row of memory cells; or the binary sequences in the test data may be successively written into one column or row of memory cells of the to-be-tested memory chip. In this case, when a quantity of memory cells in one column or row is greater than the length of the binary sequence, a plurality of different binary sequences can be written into the one column or row of memory cells. The test data can facilitate writing of the test data into the memory cell, such that an operator can set data content written into each column or row of memory cells as required, which can better match a test requirement of the memory chip.

Further, when the test data include the binary sequences with equal data bits, in an optional implementation, data bits "0" may be distributed around each data bit "1" in each binary sequence of the test data distributed by row. Each data bit may be surrounded by data bits located on upper, lower, left, and right sides of the data bit. In other words, among the binary sequences distributed by row, the data bits "0" are separately distributed on upper, lower, left, and right sides of the data bit "1" in a binary sequence. For ease of description, FIG. 3 is shows examples of a plurality of kinds of test data. As shown in the figure, each data topology represents a kind of test data, and each data topology includes two binary sequences. One binary sequence is a sequence composed of only 0, and the other binary sequence is a uniform sequence composed of "0" and "1". In the uniform sequence, "0" and "1" can be located in odd and even bits of the uniform sequence respectively. For example, data topology 1 includes binary sequences "10101010" and "00000000". For the binary sequence "10101010", "1" is in an odd bit of the sequence and "0" is in an even bit of the sequence.

Figure 4:
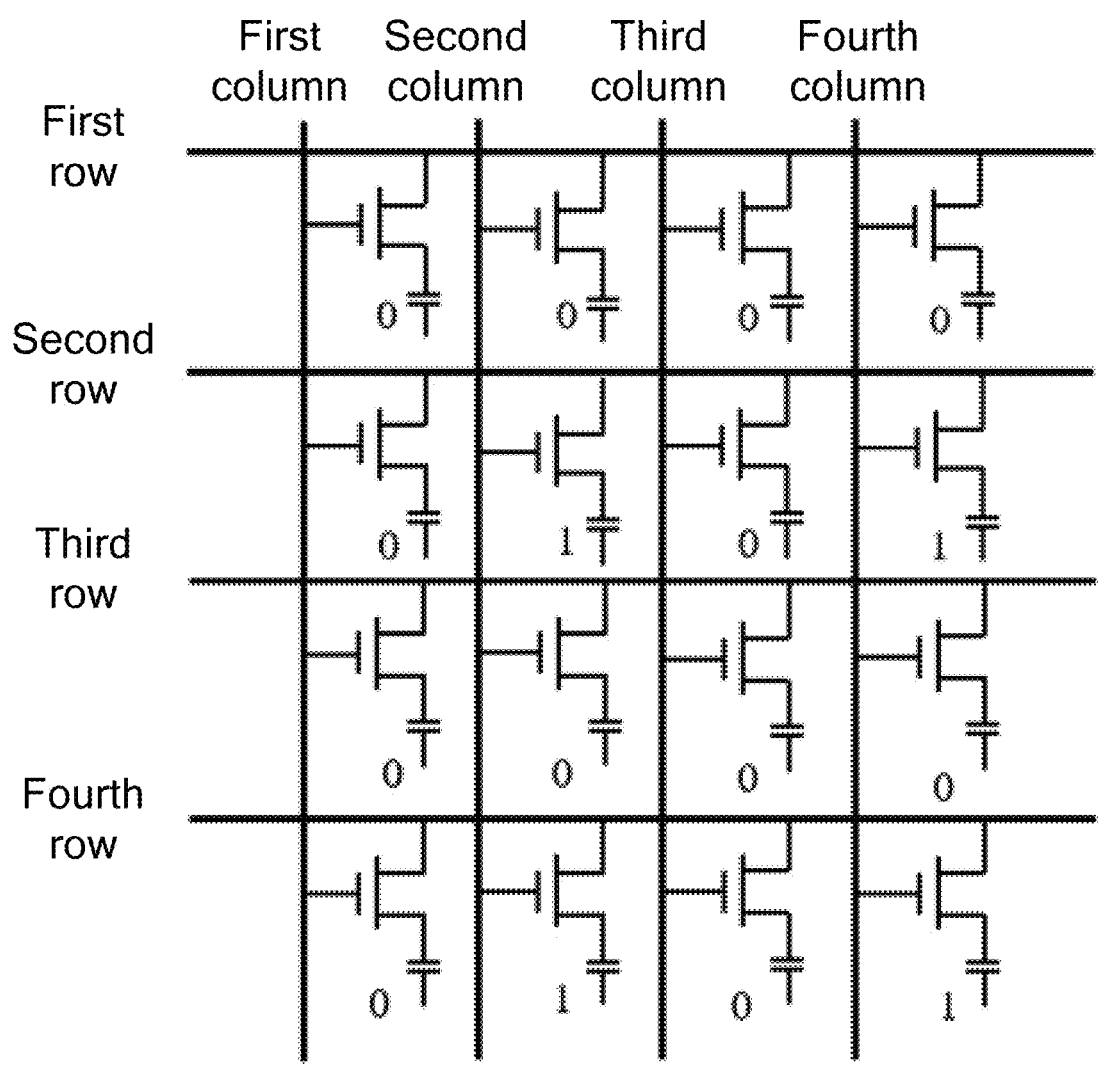
FIG. 4 is a schematic diagram of writing data into a memory cell according to an exemplary implementation.

When the test data are written into the memory cell of the to-be-tested memory chip, each binary sequence of the test data may be written into one column or row of memory cells, such that two different binary sequences can be stored in every two adjacent columns or rows of memory cells. For example, after data topology 4 shown in FIG. 3 is written into the to-be-tested memory chip by column, data stored in each column of memory cells of the to-be-tested memory chip is shown in FIG. 4, that is, "00000000" is written into first and third columns, and "01010101" is written into second and fourth columns. Due to a special distribution structure of the test data, in two adjacent columns or rows of memory cells, a memory cell storing the data bits "0" are distributed around each memory cell storing the data bit "1". This can enhance a coupling effect between memory cells and provide great help for quickly detecting performance of the memory cells.

For another example, each binary sequence of the test data may alternatively be written into a same column or row of memory cells of the to-be-tested memory chip based on a given order, for example, may be cyclically written into the same column or row of memory cells, such that different binary sequences can be written into each column or row of memory cells. In this way, the test data written into two adjacent columns or rows of memory cells may be the same or different.

Figures 5A, 5B:
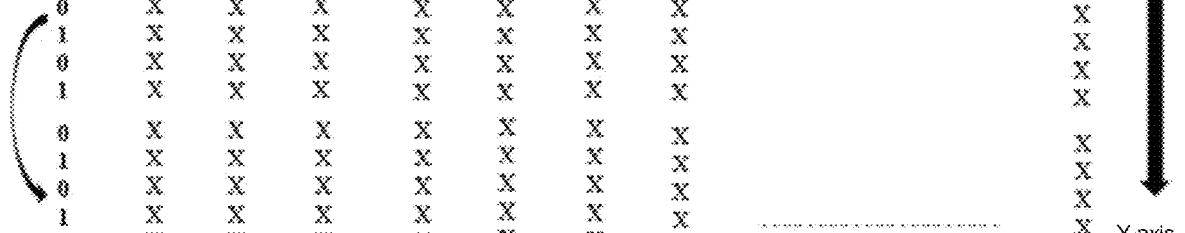
Figures 5C, 5D:
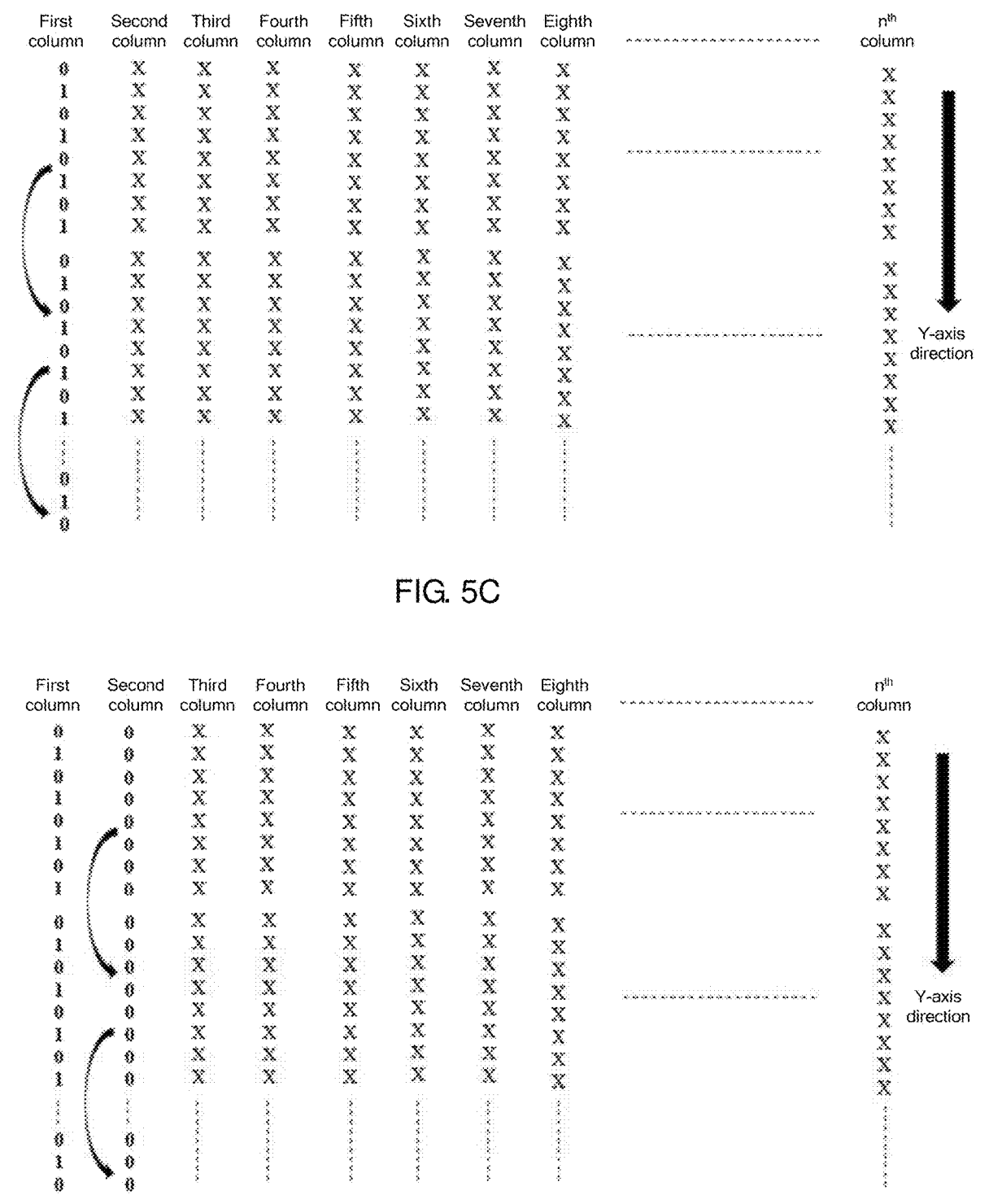
Figures 5E, 6:
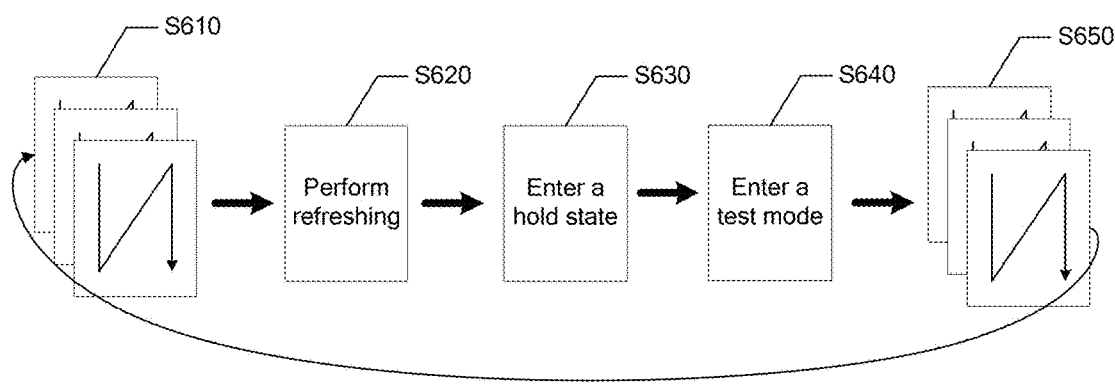

In addition, when the test data are written into the memory cell, each binary sequence of the test data may be successively written into each row of memory cells or each column of memory cells as a group of data based on a row or column order of the memory cell. For example, data topology 3 is written by column. At first, a first binary sequence "01010101" can be first written into a first group of memory cells in a first column, namely, memory cells 1 to 8, as shown in FIG. 5A. Then, the sequence "01010101" is written into a second group of memory cells in the first column, namely, memory cells 9 to 16, as shown in FIG. 5B. After the test data are written into the memory cells in the first column in this manner, the data written into the memory cells in the first column is shown in FIG. 5C. Next, a second binary sequence "00000000" is written into each group of memory cells in a second column to obtain an example of stored data as shown in FIG. 5D. The test data are written into each column of memory cells in the above manner. As shown in FIG. 5E, binary sequences written into two adjacent columns of memory cells are different.

In an optional implementation, a quantity of bits of each row of memory cells or a quantity of bits of each column of memory cells may be greater than a quantity of bits of the test data. In this case, a plurality of pieces of test data can be repeatedly written into each column or row of memory cells, and at least one piece of complete test data can be written into each column or row of memory cells, which is conducive to improving test accuracy of the memory cell. In an optional implementation, a quantity of bits of each row of memory cells or a quantity of bits of each column of memory cells may alternatively be an integer multiple of a quantity of bits of the test data. In this way, binary sequences of an integer quantity of the test data can be written into each column or row of memory cells. When the test data are written, data in each bit in the binary sequences of the test data can be written into a corresponding memory cell based on a corresponding relationship between each memory cell and a corresponding data bit, which can prevent an error in writing the test data and improve efficiency of writing the test data.

Step S120: Read stored data from the memory cell.

In reading the stored data from the memory cell, TRP (RAS (row address strobe) Precharge Time) is less than standard TRP of the to-be-tested memory chip, and/or current sensing delay time of the to-be-tested memory chip is less than standard sensing delay time of the to-be-tested memory chip. The TRP defines the time for preparing to operate a next row address in a same bank after a previous row address is completely operated and a row address inactivation command is issued, namely, precharge time of the next row address before an activation signal of the next row address is sent. The standard TRP is standard time required to complete a precharge operation of a memory cell of the next row address. The TRP is less than the standard TRP, for example, may be set to 10.5 ns. The sensing delay time of the to-be-tested memory chip is sensing delay time of a sense amplifier, in other words, delay time of detecting and amplifying a voltage difference by the sense amplifier. In the to-be-tested memory chip, the sense amplifier includes a certain quantity of transistors that are mainly used to convert data stored in the capacitor of the to-be-tested memory chip into a voltage corresponding to logic 1 or 0 and present the voltage.

After the test data are written into the memory cell of the to-be-tested memory chip, the stored data can be read from the memory cell based on the TRP and the sensing delay time of the to-be-tested memory chip. The TRP of the to-be-tested memory chip is less than the standard TRP, which results in insufficient reading for the memory cell. In addition, the current sensing delay time of the to-be-tested memory chip is less than the standard sensing delay time of the to-be-tested memory chip, which also reduces charge sharing between memory cells. In this way, a stringent environmental condition is created for detecting a failure in the memory cell, such that a failed memory cell can be exposed as early as possible, thereby improving the test efficiency of the memory chip.

In addition, in this exemplary implementation, the TRP and the sensing delay time can be defined and adjusted based on a type of the memory chip. is Taking the TRP as an example, a reduced value of the standard TRP can be set based on a given step to obtain a plurality of pieces of TRP, and each piece of TRP can be used for testing, to determine optimal TRP.

Further, due to an inherent property of the capacitor that stores the data and is of the to-be-tested memory chip, the data stored in the capacitor is gradually lost with changes of time, temperature, and the like. Therefore, to store the written data in the memory cell, in an optional implementation, after the test data are written into the memory cell of the to-be-tested memory chip, the memory cell of the to-be-tested memory chip is refreshed based on a preset refresh cycle. The preset refresh cycle may be defined based on the test requirement, for example, may be set to 100 μs. In this way, the test data can be persistently stored in the to-be-tested memory chip through refreshing, so as to avoid an error of a test result due to an external reason.

To ensure that the test data are completely written into the memory cell, in an optional implementation, the to-be-tested memory chip can be further controlled to be in a hold state within preset time after the memory cell of the to-be-tested memory chip is refreshed each time. In the hold state, the to-be-tested memory chip enters a termination stage, that is, the to-be-tested memory chip generates a control signal based on a signal control state at a last moment before entering a termination response stage, and maintains the running state for a period of time. The preset time is time during which the to-be-tested memory chip is controlled to be in the hold state each time, which can generally be set based on a processing timing of the to-be-tested memory chip. This can ensure that the to-be-tested memory chip completes writing data into each memory cell, and avoid incomplete data writing.

As described above, the test data can be written into the memory cells in the same detection cycle based on the detection cycle of the to-be-tested memory chip. Accordingly, in an optional implementation, the stored data can also be read from the memory cells in the same detection cycle. For example, based on the detection cycle of the to-be-tested memory chip, stored data may is be read from one column of memory cells corresponding to one detection cycle, to obtain stored data in all columns of memory cells. Alternatively, based on a test data length corresponding to the detection cycle, data of the corresponding test data length may be read from one column or row of memory cells of the to-be-tested memory chip, to obtain stored data in the whole to-be-tested memory chip. The detection cycle is determinate. Therefore, the above manner can ensure consistency between a cycle of written data and a cycle of read data, thereby ensuring correctness of the read data.

To test all memory cells, in an optional implementation, the columns of memory cells of the to-be-tested memory chip each may be tested through a traversal, and a direction of the traversal may be a Y direction. Specifically, during a read and write test on the to-be-tested memory chip, each memory cell in each column of memory cells of the to-be-tested memory chip can be traversed first along the Y direction, and the test data are written into each column of memory cells of the to-be-tested memory chip, such that the 1-bit data is written into all the memory cells. Then, each memory cell in each column of memory cells of the to-be-tested memory chip can be traversed along the Y direction, and stored data written into each column of memory cells are read.

In an optional implementation, each row of memory cells of the to-be-tested memory chip may alternatively be tested through a traversal based on a row of the memory cell, and a direction of the traversal may be an X direction. That is, during a read and write test on the to-be-tested memory chip, the test data can be first written into each row of memory cells of the to-be-tested memory chip along the X direction; and after the test data are written into the to-be-tested memory chip, each row of memory cells can be traversed along the X direction, and stored data written into each row of memory cells are read.

In order to test the to-be-tested memory chip comprehensively and improve test accuracy, in an optional implementation, the test data may include a plurality of groups of subtest data, and the groups of subtest data each may include two binary sequences. Therefore, the method for testing a memory chip may further include:

when writing any one of the groups of subtest data into the memory cell of the to-be-tested memory chip, reading the stored data from the memory cell, and generating a test result of the to-be-tested memory chip about the any one of the groups of subtest data based on the any one of the groups of subtest data and the stored data.

Each group of subtest data in the test data are test data of a smallest unit for completing all memory cell tests. In each group of subtest data, there are two binary sequences, which make the data bits "0" distributed around each data bit "1". For each group of subtest data, after any group of subtest data are written into the memory cell, stored data can be read from the memory cell, and a test result corresponding to the any group of subtest data can be determined based on the stored data and the any group of subtest data. Therefore, one group of subtest data may correspond to one test result. A plurality of groups of test results can be obtained by writing and reading a plurality groups of subtest data. Read and write performance of the to-be-tested memory chip can be determined more comprehensively and accurately based on the plurality of groups of test results.

In an optional implementation, the to-be-tested memory chip may include a memory array constituted by a plurality of word lines and a plurality of bit lines, and a memory cell is disposed at an intersection of one of the word lines and one of the bit lines. The memory array is a main body for storing data, which is formed by arranging many memory cells. A plurality of memory cells form an information unit. In the to-be-tested memory chip, an address decoder has n address input lines and $2n$ decoding output lines. Each decoding output line is referred to as a word line, and one word line corresponds to one information unit. Assuming that m-bit information is stored on one word line, each data output line reading the information is referred to as a bit line. When there are a group of input addresses, only one output word line of the decoder is selected. The word line can find one information unit in the memory array and send m-bit is information in the information unit to an output buffer. Based on this, step S120 may alternatively be implemented by reading, based on an order of the word lines of the to-be-tested memory chip, stored data in a memory cell corresponding to each word line in the to-be-tested memory chip. For example, starting from a first word line or any word line, the stored data in the memory cell corresponding to each word line in the to-be-tested memory chip can be successively read based on the order of the word lines of the to-be-tested memory chip, to obtain the stored data in the to-be-tested memory chip.

Further, in an optional implementation, the method for testing a memory chip may further include:

when reading stored data in memory cells corresponding to any one of the word lines, activating the any one of the word lines, reading, based on a burst length unit, the stored data in the memory cell corresponding to the any one of the word lines until stored data in all memory cells corresponding to the any one of the word lines are read, and then inactivating the any one of the word lines; and activating a next word line, and reading stored data in memory cells corresponding to the next word line.

The burst length unit refers to a quantity of memory cells involved when adjacent memory cells on a same word line perform data transmission continuously. In this transmission mode, after a row address is given, as long as a start column address and a burst length are specified, the to-be-tested memory chip can automatically and successively perform a read operation on subsequent memory cells of a corresponding quantity, without requiring a controller to continuously provide a column address.

When the read operation is performed on a memory cell corresponding to each word line, based on the order of the word lines, any word line on which the read operation needs to be currently performed can be activated based on the order of the word lines, and then stored data in memory cells that are on the word line and whose quantity is consistent with the burst length unit are read each time, until data in all memory cells on the word line are read, and is finally the word line is inactivated. The read operation is performed on the next word line in the same manner. The next word line is activated first, and then the stored data in the memory cell on the next word are read based on the burst length unit. In fact, when the stored data in the memory cell on each word line are read in this manner, the burst length unit is equivalent to a smallest reading unit, in other words, the read operation is performed on memory cells of a fixed quantity on a same word line each time. Therefore, it is not necessary to successively obtain stored data in a memory cell on each bit line address, which improves efficiency of reading the stored data.

Step S130: Generate a test result of the to-be-tested memory chip based on the test data and the stored data.

The test data are compared with the stored data to determine whether data read from each memory cell is consistent with data written into the memory cell, so as to obtain the test result of the to-be-tested memory chip. Specifically, if data read from a memory cell is inconsistent with data written into the memory cell, it indicates that read and write functions of the memory cell are abnormal and the data cannot be stored normally. On the contrary, if data read from a memory cell is consistent with data written into the memory cell, it indicates that read and write functions of the memory cell are normal.

Specifically, in an optional implementation, the test result of the to-be-tested memory chip can be generated in the following manner:

comparing the test data with the stored data, and determining, based on a comparison result, whether a read/write error occurs on the memory cell of the to-be-tested memory chip, where if the read/write error occurs on the memory cell of the to-be-tested memory chip, a quantity of bits with the read/write error is determined based on the comparison result; and generating the test result of the to-be-tested memory chip based on a determining result indicating whether the read/write error occurs on the memory cell of the to-be-tested memory chip.

For the to-be-tested memory chip, whether read and written data corresponding to each data bit is consistent can be determined by comparing the written test data with the read stored data, and then a corresponding relationship between the comparison result and the memory cell of the to-be-tested memory chip is established to determine whether read and write functions of each memory cell are normal. For a memory cell with the read/write error, a quantity of bits of the memory cell with the read/write error can be counted, and a quantity of bits of memory cells with the read/write error in the whole to-be-tested memory chip can be determined to generate the test result of the to-be-tested memory chip.

In addition, when the test data are written into the memory cell according to step S110, in order to reduce interference between memory cells between different word lines, in an optional implementation, the method for testing a memory chip may further include:

activating any word line, and inactivating the word line after writing the test data into a memory cell corresponding to the word line; and then activating a next word line, and writing the test data into memory cells corresponding to the next word line. This can reduce interference between adjacent word lines during data writing and improve test accuracy of the to-be-tested memory chip.

FIG. 6 is a flowchart of another method for testing a memory chip according to an exemplary implementation. As shown in the figure, the method for testing a memory chip may include the following steps.

Step S610: Write any group of subtest data into each column of memory cells of a to-be-tested memory chip.

A plurality of groups of subtest data constitute test data, and the groups of subtest data each include two binary sequences. In a binary sequence that is of each group of subtest data and distributed by row, data "0" are distributed around data "1". For example, the test data may include four data topologies as shown in FIG. 3, and each data topology constitutes a group of subtest data.

Step S620: Refresh the memory cells of the to-be-tested memory chip.

Specifically, after the any group of subtest data are written into each is column of memory cells of the to-be-tested memory chip, the memory cells of the to-be-tested memory chip can be refreshed based on a preset refresh cycle. In this case, the refresh process may be performed on all memory cells of the to-be-tested memory chip or on a memory cell that is of the to-be-tested memory chip and into which data has been written.

Step S630: Control the to-be-tested memory chip to enter a hold state based on preset time.

After each refresh process is completed according to step S620, the to-be-tested memory chip can be controlled to enter the hold state. The hold state lasts for the preset time. In the hold state, the to-be-tested memory chip can wait for completion of a write operation that has not been completed for a memory cell. This can ensure that data writing has been completed for most or all of the memory cells, so as to ensure accuracy of a test result.

Step S640: Control the to-be-tested memory chip to enter a test mode.

When the to-be-tested memory chip ends the hold state each time, the to-be-tested memory chip can be controlled to enter the test mode, that is, a read and write test mode can be selected by using a test mode signal of the to-be-tested memory chip, and the selected read and write test mode can be synchronized to each storage partition of the to-be-tested memory chip.

Step S650: Read stored data from the memory cells based on TRP and current sensing delay time of the to-be-tested memory chip.

After the any group of subtest data are written into all memory cells of the to-be-tested memory chip, a row address control signal can be generated based on the TRP of the to-be-tested memory chip to precharge a memory cell corresponding to each row address, and timing control is performed on a sense amplifier of the to-be-tested memory chip based on the current sensing delay time to read stored data in the to-be-tested memory chip. After that, a test result of the to-be-tested memory chip about the any group of subtest data can be determined based on a comparison result of the stored data and the any group of subtest data.

Finally, steps S610 to S650 can be performed repeatedly to write another group of subtest data to each column of memory cells of the to-be-tested memory chip, and determine a test result corresponding to the another group of subtest data until test results of all subtest data are obtained.

In conclusion, the method for testing a memory chip according to this exemplary implementation can write the test data into the memory cell of the to-be-tested memory chip, read the stored data from the memory cell, and generate the test result of the to-be-tested memory chip based on the test data and the stored data. In the process of reading the stored data from the memory cells, the TRP is less than the standard TRP of the to-be-tested memory chip, and the current sensing delay time of the to-be-tested memory chip is less than the standard sensing delay time of the to-be-tested memory chip. When the stored data are read from the memory cell, the TRP is less than the standard TRP, and the current sensing delay time is less than the standard sensing delay time of the to-be-tested memory chip, which can create a condition for insufficient reading for the memory cell and can also reduce charge sharing between memory cells. In this way, the reading for the memory cell is in a more stringent condition, which helps to expose a failed memory cell as soon as possible, thereby improving test efficiency of the memory chip.

Figure 7:
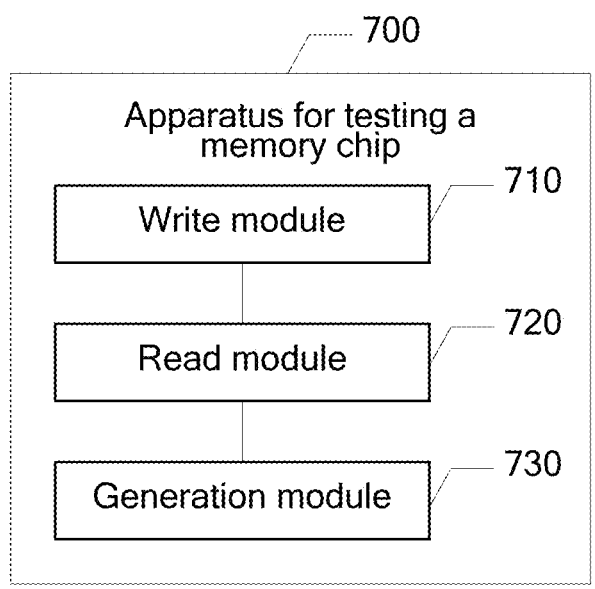
FIG. 7 is a structural block diagram of an apparatus for testing a memory chip according to an exemplary implementation.

An exemplary implementation provides an apparatus for testing a memory chip. Referring to FIG. 7, the apparatus 700 for testing a memory chip may include: a write module 710, configured to write test data into a memory cell of a to-be-tested memory chip; a read module 720, configured to read stored data from the memory cell; and a generation module 730, configured to generate a test result of the to-be-tested memory chip based on the test data and the stored data; wherein in reading the stored data from the memory cell, TRP is less than standard TRP of the to-be-tested memory chip, and/or current sensing delay time of the to-be-tested memory chip is less than standard sensing delay time of the to-be-tested memory chip.

In an exemplary implementation of the present disclosure, after writing the is test data into the memory cell of the to-be-tested memory chip, the write module 710 may be further configured to refresh the memory cell of the to-be-tested memory chip based on a preset refresh cycle.

In an exemplary implementation of the present disclosure, the write module 710 may be further configured to control the to-be-tested memory chip to be in a hold state within preset time after refreshing the memory cell of the to-be-tested memory chip each time.

In an exemplary implementation of the present disclosure, the to-be-tested memory chip includes a plurality of columns of memory cells, and one or more detection cycles are adopted for each of the columns of memory cells; the write module 710 may be configured to write the test data into memory cells in a same detection cycle; and the read module 720 may be configured to read the stored data from the memory cells in the same detection cycle.

In an exemplary implementation of the present disclosure, the columns of memory cells of the to-be-tested memory chip are tested through a traversal, and a direction of the traversal is a Y-axis direction.

In an exemplary implementation of the present disclosure, the to-be-tested memory chip includes a memory array constituted by a plurality of word lines and a plurality of bit lines, and a memory cell is disposed at an intersection of one of the word lines and one of the bit lines; and the read module 720 may be further configured to read, based on an order of the word lines of the to-be-tested memory chip, stored data in memory cells corresponding to each of the word lines in the to-be-tested memory chip.

In an exemplary implementation of the present disclosure, the read module 720 may be further configured to: when reading stored data in memory cells corresponding to any one of the word lines, activate the any one of the word lines, read, based on a burst length unit, the stored data in the memory cell corresponding to the any one of the word lines until stored data in all memory cells corresponding to the any one of the word lines are read, and then inactivate the any one of the word lines; and activate a next word line, and read stored data in memory cells corresponding to the next word line.

In an exemplary implementation of the present disclosure, the test data are a plurality of binary sequences with equal data bits, and each of the binary sequences has a different data structure.

In an exemplary implementation of the present disclosure, a quantity of bits of each row of memory cells or a quantity of bits of each column of memory cells is greater than a quantity of bits of the test data.

In an exemplary implementation of the present disclosure, a quantity of bits of each row of memory cells or a quantity of bits of each column of memory cells is an integer multiple of a quantity of bits of the test data.

In an exemplary implementation of the present disclosure, data bits "0" are distributed around each data bit "1" in each of the binary sequences of the test data distributed by row.

In an exemplary implementation of the present disclosure, the test data include a plurality of groups of subtest data, and the groups of subtest data each include two binary sequences; and the generation module 730 may be further configured to: when any one of the groups of subtest data are written into the memory cell of the to-be-tested memory chip, read the stored data from the memory cell, and generate a test result of the to-be-tested memory chip about the any one of the groups of subtest data based on the any one of the groups of subtest data and the stored data.

In an exemplary implementation of the present disclosure, the generation module 730 may be configured to: compare the test data with the stored data, and determine, based on a comparison result, whether a read/write error occurs on the memory cell of the to-be-tested memory chip, where if the read/write error occurs on the memory cell of the to-be-tested memory chip, a quantity of bits with the read/write error is determined based on the comparison result; and generate the test result of the to-be-tested memory chip based on a determining result indicating whether the read/write error occurs on the memory cell of the to-be-tested memory chip.

Specific details of the modules in the above apparatus have been described in detail in the implementations of the method. For undisclosed details of the solutions, reference may be made to the implementations of the method, and details are not described herein again.

Those skilled in the art can understand that aspects of the present disclosure may be implemented as systems, methods, or program products. Therefore, the aspects of the present disclosure may be specifically implemented in a form of a fully hardware implementation, a fully software implementation (including firmware, microcode, or the like), or a combination of hardware and software, which may be collectively referred to as a "circuit", "module", or "system".

An exemplary implementation of the present disclosure provides a computer-readable storage medium storing a program product that can be used to implement the method in this specification therein. In some possible implementations, various aspects of the present disclosure may alternatively be implemented in a form of a program product, which includes program code. When the program product runs on a terminal device, the program code is used to enable the terminal device to perform the steps according to various exemplary implementations of the present disclosure described in the foregoing "exemplary methods" of this specification.

Figure 8:
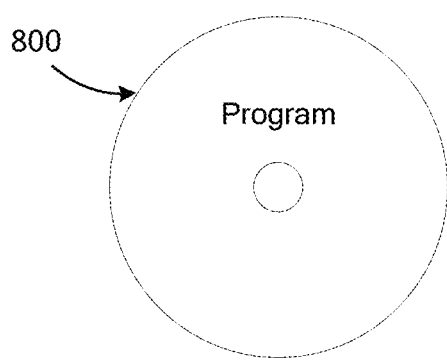
FIG. 8 illustrates a computer-readable storage medium for implementing the foregoing method according to an exemplary implementation.

Referring to FIG. 8, a program product 800 for implementing the foregoing method according to an exemplary implementation of the present disclosure is depicted, which may employ a portable compact disk read-only memory (CD-ROM) and include program code, and may run on a terminal device, such as a personal computer. However, the program product of the present disclosure is not limited hereto. In the present disclosure, a readable storage medium may be any tangible medium that contains or stores a program, and the program may be used by or in combination with an instruction execution system, apparatus, or device.

The program product 800 may be any combination of one or more readable media. The readable media each may be a readable signal medium or a readable storage medium. The readable storage medium, may be, for example, but not limited to, electrical, magnetic, optical, electromagnetic, infrared, or semiconductor systems, apparatuses, or devices, or any combination thereof. More specific examples (non-exhaustive) of the readable storage medium include an electrical connection with one or more conducting wires, a portable computer disk, a hard disk, a random access memory (RAM), a read-only memory (ROM), an erasable programmable ROM (an EPROM or a flash memory), an optical fiber, a portable CD-ROM, an optical storage device, a magnetic storage device, or any suitable combination thereof.

The computer-readable signal medium may include a data signal propagated in a baseband or as a part of a carrier, and readable program code is carried therein. The propagated data signal may be in various forms, including but not limited to an electromagnetic signal, an optical signal, or any suitable combination thereof. The readable signal medium may alternatively be any readable medium other than the readable storage medium. The readable medium may send, propagate, or transmit a program to be used by or in combination with the instruction execution system, apparatus, or device.

The program code contained on the readable medium may be transmitted using any suitable medium, including but not limited to: a wireless medium, a wired medium, an optical fiber, an RF, or any suitable combination thereof.

Program code for executing the operations in the present disclosure may be compiled by using any combination of one or more programming languages. The programming languages include object oriented programming languages, such as Java and C++, and conventional procedural programming languages, such as C or similar programming languages. The program code can be executed fully on a user computing device, executed partially on a user device, executed as an independent software package, executed partially on a user computing device and partially on a remote computing device, or executed fully on a remote computing device or a server. In a circumstance in which a remote computing device is involved, the remote computing device may be connected to a user computing device via any type of network, including a local area network (LAN) or a wide area network (WAN), or may be connected to an external computing device (for example, connected via the Internet by using an Internet service provider).

An exemplary implementation of the present disclosure provides an apparatus for testing a memory chip. An apparatus 900 according to the exemplary implementation of the present disclosure is described below with reference to FIG. 9. The apparatus 900 shown in FIG. 9 is only an example, which should not be construed as any limitation on the functions and application scopes of the implementations of the present disclosure.

Figure 9:
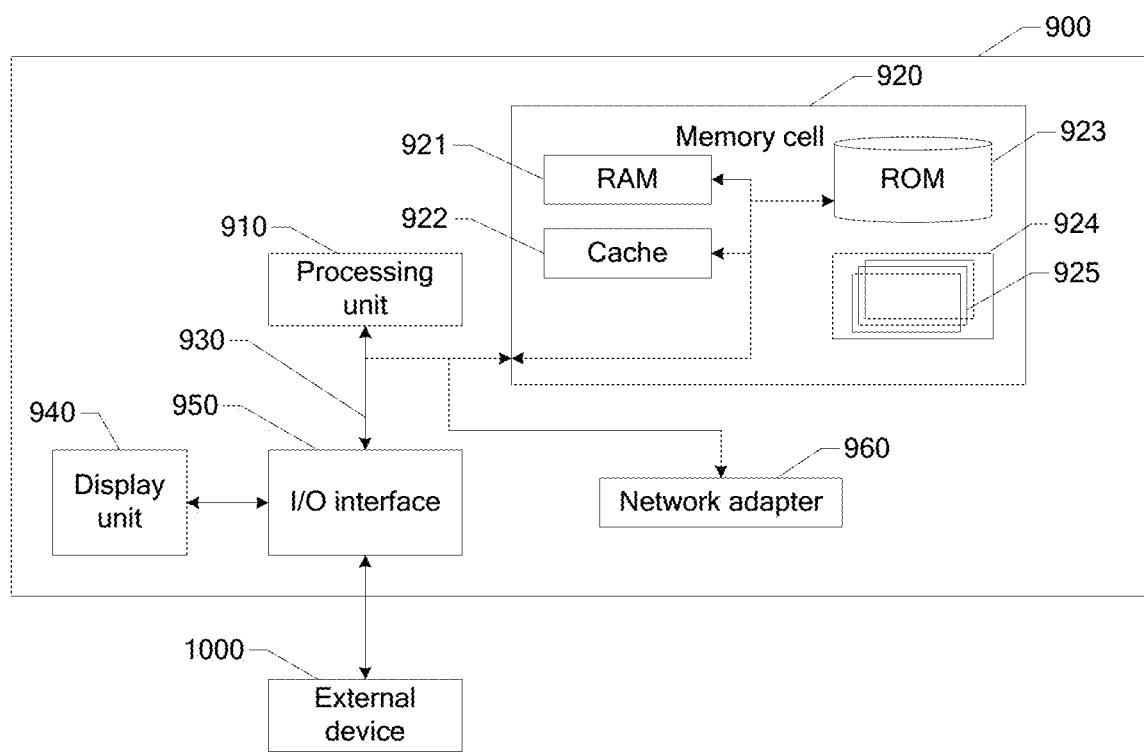
FIG. 9 illustrates an apparatus for testing a memory chip according to an exemplary implementation.

As shown in FIG. 9, the apparatus 900 may be represented in a form of a general-purpose computing device. Components of the apparatus 900 may include, but are not limited to, at least one processing unit 910, at least one memory cell 920, a bus 930 connecting different system components (including the memory cell 920 and the processing unit 910), and a display unit 940.

The memory cell 920 stores program code which can be executed by the processing unit 910, such that the processing unit 910 performs the steps according to various exemplary implementations of the present disclosure described in the "exemplary methods" of this specification. For example, the processing unit 910 may perform the method steps shown in FIG. 1 and FIG. 6.

The memory cell 920 may include a readable medium in a form of a volatile memory cell, for example, a RAM 921 and/or a cache memory cell 922, and may further include a ROM 923.

The memory cell 920 may alternatively include a program/utility 924 including a set of (at least one) program modules 925, and the program modules 925 each include, but are not limited to: an operating system, one or more applications, other program modules and program data. Each of these examples or some combination thereof may include an implementation of a is network environment.

The bus 930 may be one or more of several types of bus structures, including a memory cell bus or a memory cell controller, a peripheral bus, a graphics acceleration port, a processing unit, or a local area bus using any one of a plurality of bus structures.

The apparatus 900 may further communicate with one or more external devices 1000 (for example, a keyboard, a pointing device, or a Bluetooth device), with one or more devices that enable a user to interact with the apparatus 900, and/or with any device that enables the apparatus 900 to communicate with one or more other computing devices (for example, a router or a modem). Such communication may be performed through an input/output (I/O) interface 950. The apparatus 900 may further communicate with one or more networks (for example, a LAN, a WAN, and/or a public network such as the Internet) through a network adapter 960. As shown in the figure, the network adapter 960 communicates with other modules of the apparatus 900 through the bus 930. It should be understood that although not shown in the figure, other hardware and/or software modules may be used in combination with the apparatus 900, including but not limited to: microcode, a device driver, a redundant processing unit, an external disk drive array, an RAID system, a tape driver, and a data backup storage system.

It should be noted that although several modules or units of the device for action execution are mentioned in the detailed description above, this division is not mandatory. In fact, according to the exemplary implementations of the present disclosure, the features and functions of two or more modules or units described above may be embodied in one module or unit. Correspondingly, the features and functions of one module or unit described above may be further embodied by a plurality of modules or units.

In addition, the foregoing accompanying drawings are merely schematic illustrations of the processing included in the method according to the exemplary implementations of the present disclosure, and are not intended for is limitation. It is easily understood that the processes shown in the foregoing accompanying drawings do not indicate or impose a limitation on the chronological sequence of these processes. In addition, it is also easily understood that these processes can be performed synchronously or asynchronously, for example, in a plurality of modules.

Through the foregoing description of the implementations, persons skilled in the art may easily understand that the exemplary implementations described herein may be implemented by software, or may be implemented by software in combination with necessary hardware. Therefore, the technical solutions according to the exemplary implementations of the present disclosure may be implemented in a form of a software product. The software product may be stored in a non-volatile storage medium (which may be a CD-ROM, a USB flash drive, a removable hard disk, or the like) or on a network, and includes a plurality of instructions to enable a computing device (which may be a personal computer, a server, a terminal apparatus, a network device, or the like) to perform the method according to the exemplary implementations of the present disclosure.

Those skilled in the art can readily figure out other implementations of the present disclosure after considering this specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are pointed out by the claims.

The invention claimed is:

1. A method for testing a memory chip, comprising:
    writing test data into a memory cell of a to-be-tested memory chip;
    reading stored data from the memory cell; and
    generating a test result of the to-be-tested memory chip based on the test data and the stored data;
    wherein in the reading stored data from the memory cell, a row address strobe precharge time is less than a standard row address strobe precharge time of the to-be-tested memory chip, and/or a current sensing delay time of the to-be-tested memory chip is less than a standard sensing delay time of the to-be-tested memory chip.

2. The method according to claim 1, after the writing test data into a memory cell of a to-be-tested memory chip, the method further comprises:
    refreshing the memory cell of the to-be-tested memory chip based on a preset refresh cycle.

3. The method according to claim 1, further comprising:
    controlling the to-be-tested memory chip to be in a hold state within a preset time after refreshing the memory cell of the to-be-tested memory chip each time.

4. The method according to claim 1, wherein the to-be-tested memory chip comprises a plurality of columns of memory cells, and one or more detection cycles are adopted for each of the columns of memory cells; and the writing test data into a memory cell of a to-be-tested memory chip comprises:
    writing the test data into memory cells in a same detection cycle; and
    the reading stored data from the memory cell comprises:
    reading the stored data from the memory cells in the same detection cycle.

5. The method according to claim 4, wherein the columns of memory cells of the to-be-tested memory chip are tested through a traversal, and a direction of the traversal is a Y-axis direction.

6. The method according to claim 4, wherein the to-be-tested memory chip comprises a memory array constituted by a plurality of word lines and a plurality of bit lines, and a memory cell is disposed at an intersection of one of the word lines and one of the bit lines; and the reading stored data from the memory cell further comprises:
    reading, based on an order of the word lines of the to-be-tested memory chip, stored data in memory cells corresponding to each of the word lines in the to-be-tested memory chip.

7. The method according to claim 6, further comprising:
    when reading stored data in memory cells corresponding to any one of the word lines, activating the any one of the word lines, reading, based on a burst length unit, the stored data in the memory cells corresponding to the any one of the word lines until the stored data in all of the memory cells corresponding to the any one of the word lines are read, and then inactivating the any one of the word lines; and activating a next word line, and reading stored data in memory cells corresponding to the next word line.

8. The method according to claim 1, wherein the test data are a plurality of binary sequences with equal data bits, and each of the binary sequences has a different data structure.

9. The method according to claim 8, wherein a quantity of bits of each row of memory cells or a quantity of bits of each column of memory cells is greater than a quantity of bits of the test data.

10. The method according to claim 8, wherein a quantity of bits of each row of memory cells or a quantity of bits of each column of memory cells is an integer multiple of a quantity of bits of the test data.

11. The method according to claim 8, wherein data bits "0" are distributed around each data bit "1" in each of the binary sequences of the test data distributed by row.

12. The method according to claim 11, wherein the test data comprise a plurality of groups of subtest data, and each of the groups of subtest data comprise two binary sequences; and the method further comprises:
    when writing any one of the groups of subtest data into the memory cell of the to-be-tested memory chip, reading the stored data from the memory cell, and generating a test result of the to-be-tested memory chip about the any one of the groups of subtest data based on the any one of the groups of subtest data and the stored data.

13. The method according to claim 1, wherein the generating a test result of the to-be-tested memory chip based on the test data and the stored data comprises: comparing the test data with the stored data, and determining, based on a comparison result, whether a read/write error occurs on the memory cell of the to-be-tested memory chip, wherein when the read/write error occurs on the memory cell of the to-be-tested memory chip, a quantity of bits with the read/write error is determined based on the comparison result; and
    generating the test result of the to-be-tested memory chip based on a determining result indicating whether the read/write error occurs on the memory cell of the to-be-tested memory chip.

14. A non-transitory computer-readable storage medium, storing a computer program therein, when the computer program is executed by a processor, the processor implements the method according to claim 1.

15. An apparatus for testing a memory chip, comprising:
    a processor; and
    a memory, configured to store an instruction executable by the processor; wherein the processor is configured to execute:
    writing test data into a memory cell of a to-be-tested memory chip;
    reading stored data from the memory cell; and
    generating a test result of the to-be-tested memory chip based on the test data and the stored data; wherein
    in the reading stored data from the memory cell, a row address strobe precharge time is less than a standard row address strobe precharge time of the to-be-tested memory chip, and/or a current sensing delay time of the to-be-tested memory chip is less than a standard sensing delay time of the to-be-tested memory chip.

* * * * *